US007442618B2

United States Patent
Chong et al.

(10) Patent No.: US 7,442,618 B2
(45) Date of Patent: Oct. 28, 2008

(54) METHOD TO ENGINEER ETCH PROFILES IN SI SUBSTRATE FOR ADVANCED SEMICONDUCTOR DEVICES

(75) Inventors: Yung Fu Chong, Singapore (SG); Brian Joseph Greene, Yorktown Heights, NY (US); Siddhartha Panda, Beacon, NY (US); Nivo Rovedo, Lagrangeville, NY (US)

(73) Assignees: Chartered Semiconductor Manufacturing, Ltd, Singapore (SG); International Business Machines Corporation (IBM)

( * ) Notice: Subject to any disclaimer, the term of this patent is extended or adjusted under 35 U.S.C. 154(b) by 383 days.

(21) Appl. No.: 11/182,682

(22) Filed: Jul. 16, 2005

(65) Prior Publication Data

US 2007/0020861 A1 Jan. 25, 2007

(51) Int. Cl.
*H01L 21/44* (2006.01)

(52) U.S. Cl. ....................... 438/424; 438/410; 438/435; 438/437; 257/E21.549

(58) Field of Classification Search ................. 438/296, 438/424, 410, 435, 437; 257/E21.549
See application file for complete search history.

(56) References Cited

U.S. PATENT DOCUMENTS

| | | | | |
|---|---|---|---|---|
| 4,533,430 | A | 8/1985 | Bower | |
| 5,915,192 | A | 6/1999 | Liaw | |
| 6,228,745 | B1 * | 5/2001 | Wheeler et al. | 438/424 |
| 6,313,008 | B1 | 11/2001 | Leung | |
| 6,716,757 | B2 | 4/2004 | Lin | |
| 6,800,535 | B1 | 10/2004 | Tsai | |
| 6,869,884 | B2 * | 3/2005 | Chan et al. | 438/705 |
| 6,882,025 | B2 * | 4/2005 | Yeo et al. | 257/510 |

* cited by examiner

*Primary Examiner*—Michael S Lebentritt
(74) *Attorney, Agent, or Firm*—Horizon IP Pte Ltd

(57) ABSTRACT

Structures and methods for forming keyhole shaped regions for isolation and/or stressing the substrate are shown. In a first embodiment, we form an inverted keyhole shaped trench in the substrate in the first opening preferably using a two step etch. Next, we fill the inverted keyhole trench with a material that insulates and/or creates stress on the sidewalls of the inverted keyhole trench. In a second embodiment, we form a keyhole stressor region adjacent to the gate and isolation structures. The keyhole stressor region creates stress near the channel region of the FET to improve FET performance. The stressor region can be filled with an insulator or a semiconductor material.

21 Claims, 5 Drawing Sheets

40
40A
50
18
14
42
40B
44
10

METHOD TO ENGINEER ETCH PROFILES IN SI SUBSTRATE FOR ADVANCED SEMICONDUCTOR DEVICES

BACKGROUND OF INVENTION

1) Field of the Invention

This invention relates generally to fabrication of semiconductor devices and more particularly to the fabrication of isolation regions and/or stress regions.

2) Description of the Prior Art

As the channel length continues to shrink, substrate engineering becomes one of the key methods to improve the performance of CMOS devices. This is achieved by stress enhancement on the NFET or PFET.

Another important aspect in substrate engineering is to form adequate isolation features between the devices to suppress the effect of latch-up. Latch-up is a phenomenon that establishes a very low resistance path between the $V_{DD}$ and $V_{SS}$ power lines, allowing large currents to flow through the circuit. This can cause the circuit to cease functioning or even destroy itself due to high power dissipation.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

U.S. Pat. No. 4,533,430: Process for forming slots having near vertical sidewalls at their upper extremities—Inventor: Bower, Robert W.; Los Gatos, Calif.

U.S. Pat. No. 6,313,008: Method to form a balloon shaped STI using a micro machining technique to remove heavily doped silicon—Inventor: Leung, Ying Keung; Hong Kong, China.

U.S. Pat. No. 6,800,535: Method for forming bottle-shaped trenches—Title: Forming bottle trench—Inventor: Tsai, Tzu-Ching; Taoyuan.

U.S. Pat. No. 5,915,192: Method for forming shallow trench isolation—Inventor: Liaw, Jhon-Jhy; San Chung, Taiwan.

U.S. Pat. No. 6,716,757: Method for forming bottle trenches—Title: Method to form a bottle-shaped trench—Inventor: Lin, Shian-Jyh.

SUMMARY OF THE INVENTION

An aspect of an embodiment is a two step etch process for forming an inverted keyhole shaped trench in a substrate.

Some example embodiments of the present invention provide a structure and a method of manufacturing CMOS transistors with improved isolation and/or enhanced FET performance.

Some example embodiments of the present invention provide a structure and a method of manufacturing CMOS transistors with inverted keyhole shaped trench stressor regions filled with semiconductor or dielectric material.

An example embodiment for a method of fabrication of an inverted keyhole shaped trench in a semiconductor device; comprises the steps of:

- forming an inverted keyhole shaped trench in said substrate in said first opening using a two step etch comprising:
  - in a first etch step, etching the substrate using an anisotropic etch to form an upper trench having first sidewalls;
  - in a second etch step, etching the substrate using an isotropic etch through the upper trench to form a rounded lower trench; the upper trench and the rounded lower trench form a inverted keyhole trench.

An example embodiment is a method of fabrication of an inverted keyhole trench in a semiconductor device; comprises the steps of:

- forming an inverted keyhole shaped trench in said substrate;
- at least partially filling the inverted keyhole shaped trench with an material creates stress on the sidewalls of the inverted keyhole shaped trench to form a stress region.

In an aspect of the embodiment, the inverted keyhole shaped trench is filled with an dielectric material.

In an aspect of the embodiment, the inverted keyhole shaped trench is filled with a semiconductor material.

An example embodiment is a semiconductor device having stress creating regions comprising:

- a gate structure over a substrate;
- stress regions in inverted keyhole shaped trenches on opposite sides of said gate structure;
- the stress region creates stress in the substrate under the gate structure.

In an aspect of the embodiment, the semiconductor device further comprises: the stress region are isolation regions in said substrate spaced from said gate structure;

source and drain regions are adjacent to said gate structure.

In an aspect of the embodiment, the semiconductor device further comprises: isolation regions in said substrate spaced from said gate structure;

the stress regions are stressor regions that are comprised of an semiconductor material;

the source and drain regions are adjacent to said gate structure; source and drain region are at least partially in said stressor regions.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1, 2, 3, 4A, and 4B, show cross sectional views of an example embodiment for forming the inverted keyhole shaped trench 40 that can be used to form an isolation region and/or a stress creating region.

DETAILED DESCRIPTION OF THE EXAMPLE EMBODIMENTS

A. Overview

The example embodiments are related to methods to engineer etch profiles in substrates for advanced semiconductor devices. The recess is preferably formed using an in-situ multi-step etch process with varying lateral and vertical etch components.

Potential applications include stress enhancement of NFET or PFET by creating recesses at desired depths and locations and filling the recess with suitable materials such as Spin-on-glass (SOG), $SiO_2$, SiGe etc. For e.g., for embedded SiGe devices, the recess can be made closer to the channel to increase the stress level, thus enhancing device performance.

Another potential application is to form STI with inverted "key hole" profiles. This greatly increases the resistance of the electrical path of the carriers in the substrate, thus minimizing latch-up probability.

An aspect example embodiment, as shown in FIGS. 1 to 4A and 4B, is a method to form an inverted keyhole shaped trench.

Figure 7:
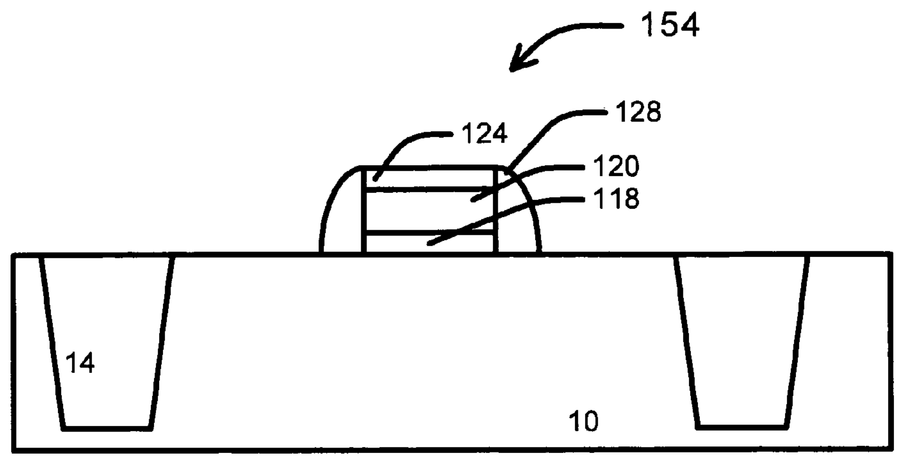
Figure 8:
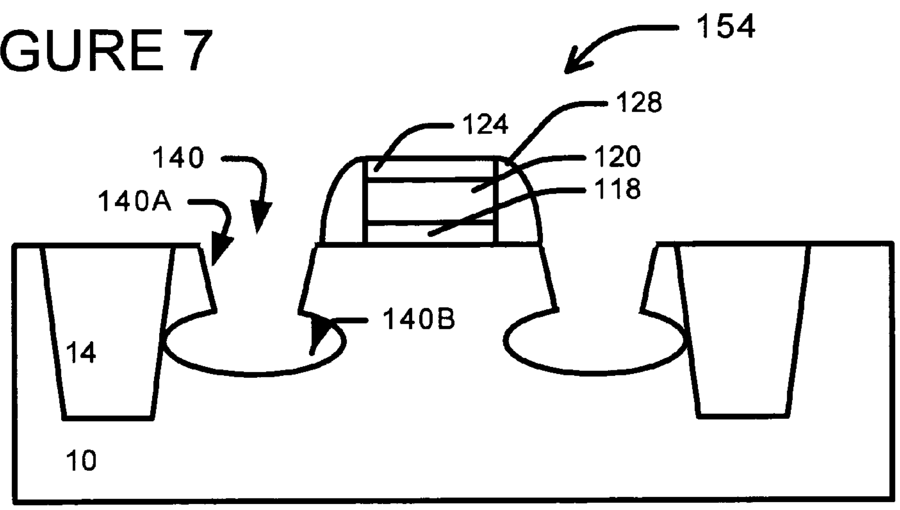
FIGS. 8 and 9 show cross sectional views of an example embodiment for forming the inverted keyhole shaped trench that is used to form a stress creating region.
Figure 9:
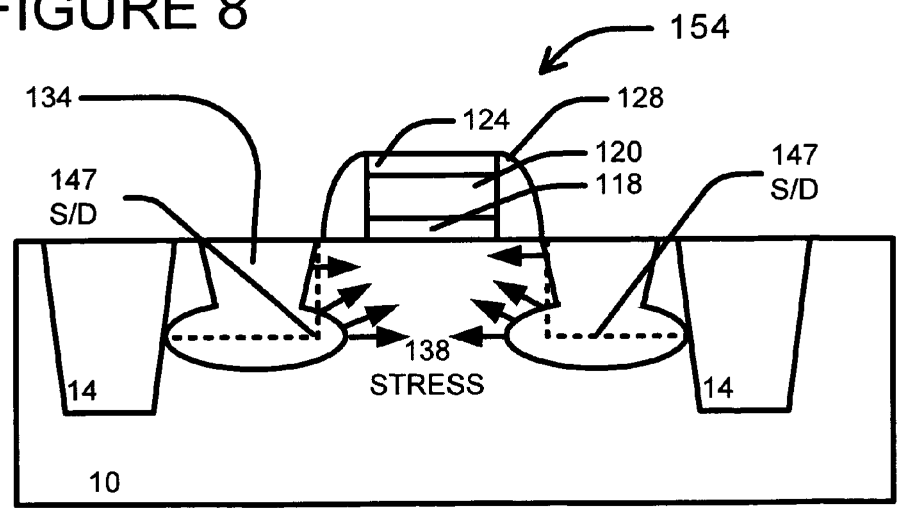

In a first embodiment, we describe a method and structure for forming an inverted keyhole shaped trench for an isolation region and/or stress creating region. The second example embodiment is shown in FIGS. 7 to 9. The second example embodiment shows a method for forming a stressed channel with keyhole shaped source/drain regions in a semiconductor device.

B. First Example Embodiment

A first example embodiment is a method and structure for forming an inverted keyhole shaped trench that can be used to form an isolation region and/or stress creating region.

FIGS. 1 to 3, 4A and 4B show an example embodiment for forming the inverted keyhole shaped trench.

Figure 5:
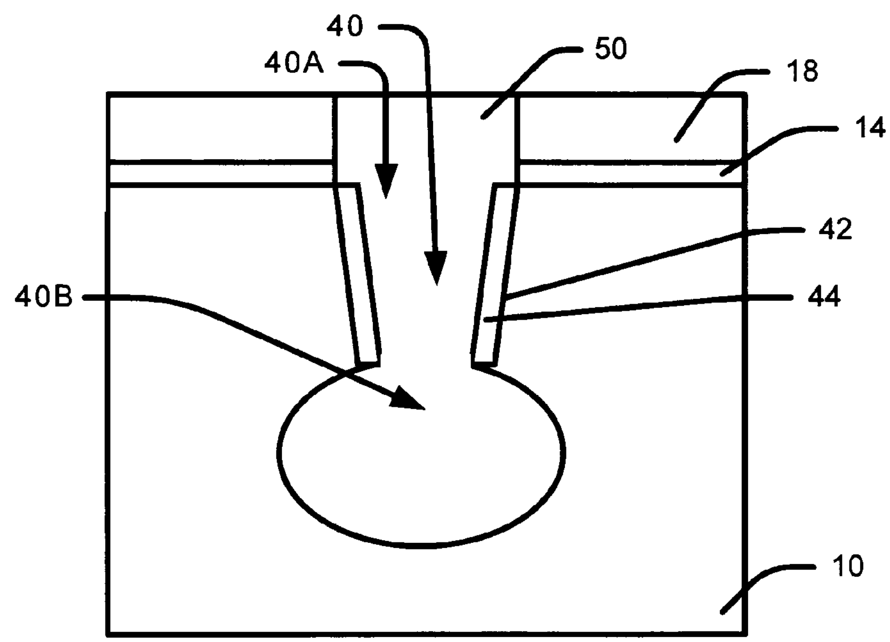
FIGS. 5, and 6 show cross sectional views of an example embodiment for forming the inverted keyhole shaped trench that is used to form an isolation region.
Figure 6:
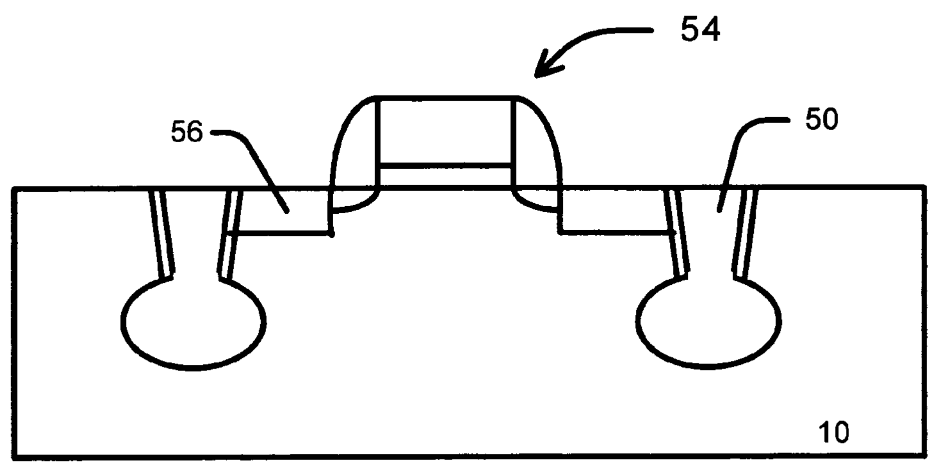

FIGS. 5 and 6 show a completed inverted keyhole shaped trench 40 for an isolation region and/or stress creating region.

C. Form an Etch Mask Film Over a Substrate

Figure 1:
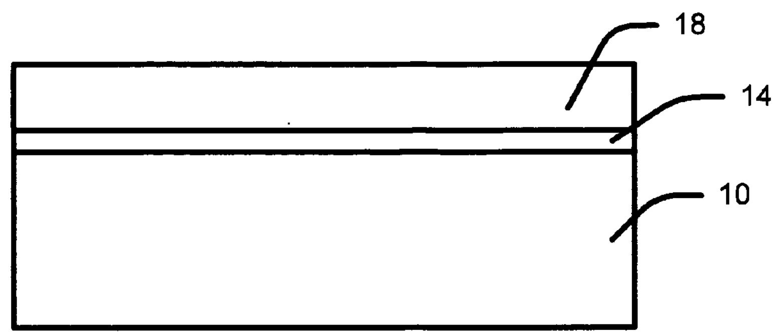
Figure 2:
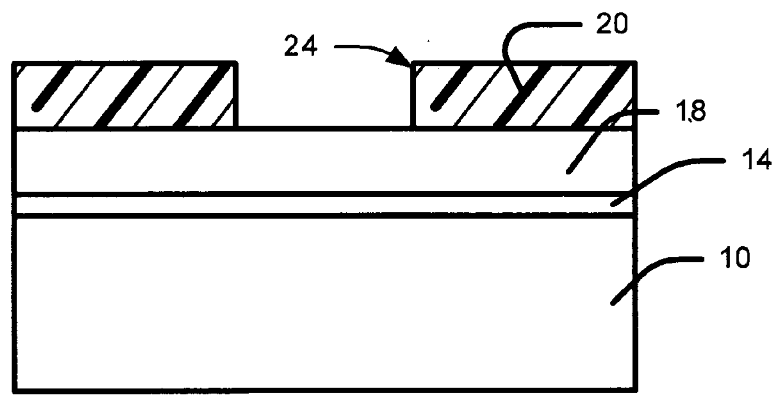
Figure 3:
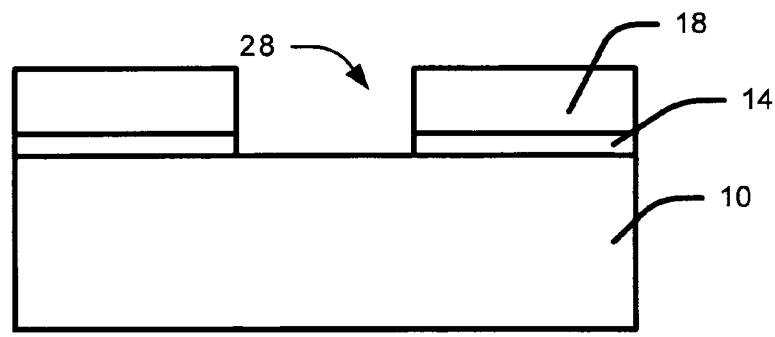

Referring to FIG. 1, we form an etch mask film over a substrate 10. The etch mask film can be comprised of 1 or more layers. For example, as shown in FIG. 1, the etch mask film is comprised of a lower pad oxide layer 14 with a thickness between 100 and 600 angstroms and a overlying nitride layer 18 having a thickness between 1000 and 3000 angstroms.

The substrate 10 can be comprised of crystalline silicon with a (100) or (110) orientation, a silicon on insulator (SOI) substrate, strained silicon or SiGe with varying Ge concentrations or other suitable semiconductor materials and substrate structures such as SOI substrates.

D. Form a First Opening through the Etch Mask Film to Expose the Substrate Surface Referring to FIGS. 2 and 3, we form a first opening 28 through the etch mask film 14 18 to expose the substrate surface. In an example method, we form a resist layer 20 having a first resist opening 24 that is formed over the etch mask film 14 18.

We can form the first opening 28 using the resist layer 20 as a etch mask, by etching through the etch mask film 14 18 to expose the substrate surface.

Then we remove the resist layer 20.

E. Form an Inverted Keyhole Shaped Trench

Figure 4B:
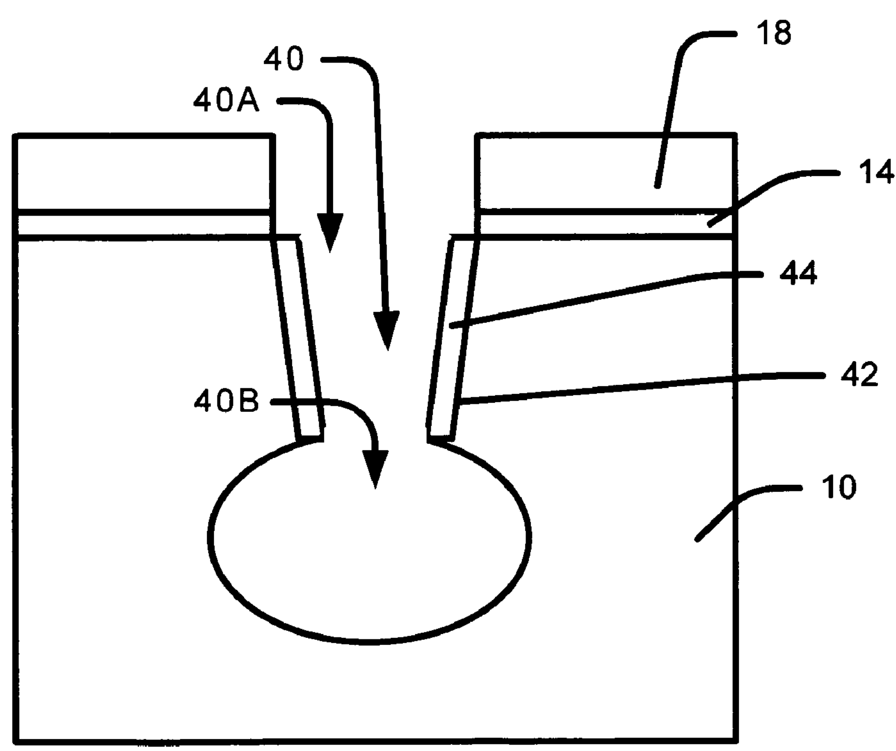

Referring to FIGS. 4A and 4B, we form an (inverted) keyhole shaped trench 40 in said substrate in said first opening preferably using a 2 step etch process. This 2 step etch process is preferably done in-situ in the same processing chamber, i.e. sequentially without breaking vacuum.

Step 1—Dry Anisotropic Etch to Form Preferably Slanted Sidewalls and Passivation Layer As shown in FIG. 4A in a first etch step, we anisotropic etch the substrate to form an upper trench preferably having slanted (non-vertical) sidewalls 42. An example of an appropriate dry anisotropic etch is the following: Gases: HBr, at a flow rate between 200 and 800 sccm; and He at a flow rate between 200 and 800 sccm, and/or $O_2$ at a flow rate between 5 and 60 sccm; at a temperature: between 50 and 80 degrees C.; at a pressure between 10 and 80 mT; at a power between 20 and 100 W; and for a duration between 10 and 80 sec.

Prior to the anisotropic dry etch, it is optional to perform a breakthrough etch to remove any native oxide on the Substrate surface. An example of an appropriate breakthrough etch is the following: Gases: $CF_4$, at a flow rate between 50 and 150 sccm; at a temperature: between 50 and 80 degrees C.; at a pressure between 5 and 50 mT; at a power between 60 and 120 W; and for a duration between 1 and 12 sec.

The sidewalls 42 preferably have an angle 53 from vertical between 0 and 60 degrees and more preferably between 5 and 30 degrees. Zero degrees means that it can also be vertical, depending on etch condition and spacing between structures to be etched.

The anisotropic dry etch forms a passivation layer 44 on the slanted sidewalls 42. The passivation layer 44 is etch resistant in the second etch step. For the example anisotropic dry etch process, the passivation layer 44 is a by-product of the anisotropic etch and comprises of silicon oxybromide ($SiO_xBr_y$).

Step 2—Second Etch Step, Isotropic Dry Etch to Form a Rounded Lower Trench

In a second etch step, as shown in FIG. 4B, we isotropically dry etch the substrate to form a rounded lower trench 40B. The second etch is preferably done in-situ in the same processing chamber as the anisotropic dry etch. The upper trench 40A and the rounded lower trench 40B form an inverted keyhole trench 40.

An example isotropic etch process for forming the rounded lower trench 40B comprises: flowing Gases: $Cl_2$, and/or $SF_6$, at a flow rate: between 10 and 200 sccm; at a temperature between about 50 and 80 C; at a pressure: between 10 and 80 mTorr; at a power between 20 and 100 W; for a duration between 10 and 80 sec.

F. Aspect—Fill the Inverted Keyhole Shaped Trench

Referring to FIG. 5, we fill the inverted keyhole trench 40 with a material 50 that optionally creates stress on the sidewalls of the inverted keyhole trench 40.

In the first embodiment for forming an isolation region in the inverted keyhole shaped trench. This isolation region optionally stress can be compressive or tensile. This can be followed by chemical mechanical polishing (CMP) to planarize the surface.

Prior to the filling of the inverted keyhole trench 40, it is preferable to remove the passivation layer 44 by wet etch or dry etch.

The material 50 is preferably a dielectric such as silicon dioxide ($SiO_2$), Spin-on-glass (SOG), tetraethyl orthosilicate (TEOS) or high density plasma (HDP) chemical vapor deposited oxide.

A compressive dielectric (e.g., oxide) material in the isolation region puts a compressive stress on the substrate (channel region). Similarly, a tensile oxide material in the isolation region puts a tensile stress on the substrate (channel region).

Oxide materials, and other materials, can be made to be compressive, tensile or neutral depending on the process used to form the oxide materials.

The embodiment's keyhole shape is an advantage. As compared to a regular trench with vertical sidewalls of the same depth, the inverted keyhole shape increases the distance the carrier have to travel to cause isolation failure. Hence, the resistance of the electrical path of the carriers in the substrate is increased, and the probability of latch-up is minimized.

The upper slanted sidewalls can have an advantage over vertical sidewalls because the slanted sidewall is to be used in conjunction with the rounded bottom trench, it can reduce latch-up probability.

The rounded bottom trench 40B has an advantage because it increases the stress in the channel region if the width of the rounded bottom trench 40B is large enough to influence the stress in the channel.

G. Keyhole Shaped Isolation

FIG. 6 shows an example of the embodiment keyhole shaped isolation regions 50 used as isolation regions for a gate structure 54 and source drain regions 56. For example, the embodiment keyhole shaped isolation regions 50 can be used in place of shallow trench isolation (STI) regions.

The main function of isolation regions 50 is to provide isolation between devices hence it must be an insulator. The regions 50 can put compressive or tensile stress on the channel to improve FET performance provided that the width of the rounded bottom trench 40B is large enough to influence the stress in the channel. Materials: tensile or compressive oxide.

II. Second Embodiment—Stressor Regions in FET Device

A second example embodiment is shown in FIGS. 7, 8 and 9. FIGS. 8 and 9 show a method for forming keyhole stressor regions in a semiconductor device.

A. Provide a Gate Structure

We provide a gate structure 154 over a substrate 10 and isolation regions in the substrate spaced from the gate structure. The example gate structure can comprise a gate dielectric 118, a gate electrode 120, a nitride cap 124, and nitride spacers 128. Example isolation structures can be shallow trench isolation (STI) regions 14 comprised of an oxide such as TEOS oxide.

B. Forming a Keyhole Shaped Trench

Referring to FIG. 8, we form an inverted keyhole shaped trench 140 adjacent to the isolation regions and the gate structure 154 using the isolation regions and gate structure as an etch mask.

The keyhole shaped trench is preferably formed using a two step etch process as described above in the first embodiment. Preferably the upper slanted sidewall trench 140A is preferably formed using a dry anisotropic etch that forms a passivation layer (not shown) on the sidewalls. In the second etch step, a dry isotropic etch step, the lower rounded trench 140B is formed. In addition, other methods can used to form the two step etch process.

C. Filling the Keyhole Shaped Trench with a Material that Creates Stress in the Substrate Under the Gate Structure.

As shown in FIG. 9, we fill the keyhole shaped trench with a material 134 that creates stress in the substrate under the gate structure. In the case where the source/drain (S/D) regions of the transistor were etched, the filled keyhole shaped trench also function as the S/D regions of the transistor.

A compressively stressed filler material (stressor) in the S/D region puts a compressive stress in the channel region under the gate structure. This is beneficial for PMOSFET. An example of a compressively stressed filler material is SiGe.

Similarly, a tensile stressor material in the S/D region puts a tensile stress in the channel region, which is beneficial for NMOSFET. An example of a tensile stressor material is SiC.

The stressor material 134 is preferably comprised of $Si_{(1-x)}Ge_x$, $Si_{(1-x)}C_x$ or $Si_{(1-x-y)}B_xGe_y$, where x is between 0.1 and 0.8, and y is between 0.1 and 0.8, and are most preferably comprised of $Si_{(1-x)}Ge_x$. The $Si_{(1-x)}Ge_x$ can be undoped or in-situ doped with boron. The $Si_{(1-x)}C_x$ can be undoped or in-situ doped with phosphorous. The thickness of the epitaxial stressor 134 can be between 30 and 240 nm.

D. Finishing the FET

Source and Drain (S/D) regions 147 can be fabricated by a few methods:

(1) form S/D regions 147 by ion implantation into the stressor regions 134 and substrate The S/D regions 147 are indicated by the dotted lines in FIG. 9, This can be followed by a thermal anneal process. Preferably we use a RTA process with a temperature between 900 and 1300 C for a time between 500 micro-sec and 5 seconds.

(2) By using in-situ doped filler materials (stressors). For e.g., we can use in-situ boron doped SiGe as a filler material for PFET. Hence, the stressor regions 134 become the S/D regions.

Keyhole shaped stressor 134 can be designed to be to put a specific amount of stress on the channel by changing the distance from the stressor 134 and the channel. We can position the stressor 134 closer to the channel to increase the stress level in the channel thus enhancing device performance.

The stressor regions 134, especially the bottom rounded trench portion, can be made closer to the channel so that the stress in the channel is increased.

A compressively stressed filler material (stressor) in the S/D region puts a compressive stress in the channel region under the gate structure. This is beneficial for PMOSFET. Material: SiGe.

Similarly, a tensile stressor in the S/D region puts a tensile stress in the channel region, which is beneficial for NMOSFET. Material: SiC.

The rounded trench 140B allows a greater volume of stressor material that can be filled at the same depth. Also, the stressor can be made closer to the channel so that the stress in the channel is increased.

E. Inverted Trench Shape

Figure 10:
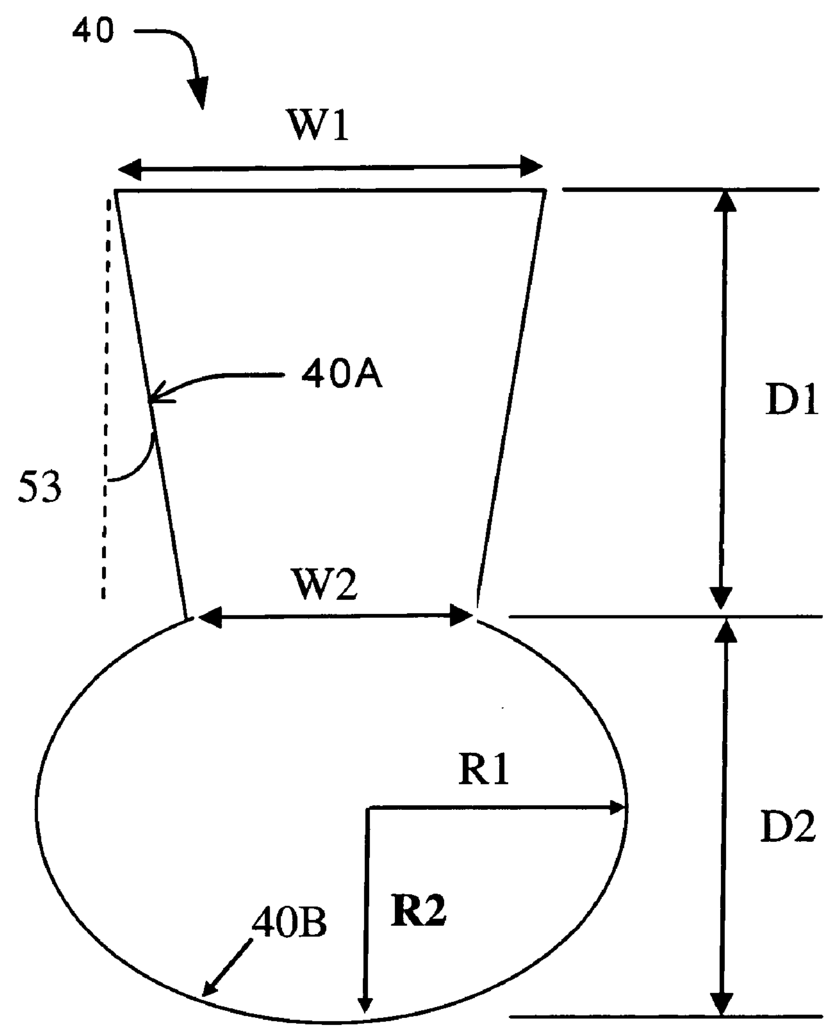
FIG. 10 shows a cross sectional views of an example embodiment for forming the inverted keyhole shaped trench.

FIG. 10 shows a generalized view of an example inverted keyhole shaped trench 40 comprised of a upper trench 40A having first sidewalls 42 and a rounded lower trench 40B.

For example, the slanted (non-vertical) first sidewalls 42 preferably have an angle 53 from vertical between 1 and 60 degrees and more preferably between 5 and 30 degrees. An option is a trench with vertical sidewalls where the angle 53 is about zero. The slope of the sidewall can depend on etch conditions and spacing between structures to be etched.

For example, the ratio of D1 to D2 (D1/D2) is between 0.3 and 2.2. The ratio of W1 to W2 (W1/W2) is between 1 and 2 and more preferably between 1.05 and 1.3.

The ratio of D1 (depth of upper trench 40A) and R1 (50% of greatest horizontal width of the rounded trench 40B) or can be between 0.2 and 2.

The rounded lower trench 40B may be spherical (were R1 and R2 are equal) or ellipsoidal where R1 is not equal to R2. The ratio of R1 and R2 (R1/R2) is preferably between 0.2 and 2.

F. Non-limiting Example Embodiments

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention.

Unless explicitly stated otherwise, each numerical value and range should be interpreted as being approximate as if the word about or approximately preceded the value of the value or range.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a trench comprising:

etching a substrate to form an upper portion of a trench, wherein the etching forms a passivation layer on sidewalls of the upper portion of the trench;

etching the substrate to form a rounded lower portion of the trench having a width greater than the upper portion, wherein the passivation layer protects the upper portion from being etched during etching to form the lower portion; and wherein the upper portion and the rounded lower portion form an inverted keyhole trench.

2. The method of claim 1 wherein the upper portion comprises slanted sidewalls.

3. The method of claim 1 wherein the upper portion comprises slanted sidewalls having an angle from vertical between 1 and 60 degrees or 5 and 30 degrees.

4. The method of claim 1 which further includes filling the inverted keyhole trench with a material that insulates and creates compressive or tensile stress on the sidewalls of the inverted keyhole trench.

5. The method of claim 1 which farther includes forming a FET device having a channel region in said substrate; and filling the inverted keyhole trench with a material that insulates and creates compressive or tensile stress on the channel region.

6. The method of claim 1 further comprises forming a transistor having gate structure and a channel region in said substrate; and forming a plurality of trenches adjacent to the gate structure, wherein the trenches comprises upper portions and lower rounded portions with a width greater than the upper portions;

filling the trenches with a stress creating material to form stressor regions; and forming source and drain regions at least partially in the stressor regions.

7. The method of claim 1 wherein the etching of the upper portion comprises an anisotropic etch and the etching of the lower portion comprises an isotropic etch.

8. The method of claim 7 wherein the anisotronic and isotropic etches comprise dry etches.

9. The method of claim 8 wherein the dry etches are performed insitu.

10. A method of fabricating a semiconductor device comprising:

providing a substrate;

etching an upper portion of a trench in the substrate, wherein a passivation layer is formed on sidewalls of upper portion of the trench during etching;

etching a lower portion of the trench while the passivation layer protects the upper portion, the lower portion comprises a rounded lower portion with a width greater than the upper portion;

wherein the upper and lower portions form an inverted keyhole trench; and at least partially filling the inverted keyhole shaped trench with a material to create stress on the sidewalls of the inverted keyhole shaped trench to form a stress region.

11. The method of claim 10 wherein the upper portion comprises slanted sidewalls.

12. The method of claim 10 comprises filling the trench with a dielectric or semiconductor material.

13. The method of claim 10 wherein the etching of the upper portion comprises an anisotropic etch and the etching of the lower portion comprises an isotropic etch wherein the anisotropic etch forms a passivation layer on the first sidewalls and the passivation layer is etch resistant to the isotropic etch.

14. The method of claim 10 wherein the etching of the upper portion comprises an anisotropic etch and the etching of the lower portion comprises a dry isotropic etch.

15. The method of claim 10 wherein the etching of the upper portion comprises a dry anisotropic etch and the etching of the lower portion comprises a dry isotropic etch, wherein the anisotropic and isotropic etches are performed insitu.

16. A method for forming stressor regions comprising:

providing a substrate prepared with isolation regions defining an active region and a gate structure on the substrate in the active region;

forming trenches in source/drain regions adjacent to the isolation regions and the gate structure, wherein forming the trenches comprises etching upper portions of the trenches in the source/drain regions of the substrate, wherein passivation layers are formed on sidewalls of the upper portions of the trenches during etching, and etching lower portions of the trenches to form rounded lower portions with widths greater than the upper portions, the passivation layers protecting the upper portions during etching to form the lower portions; and filling the trenches with a stress material to form stressor regions, wherein the stressor regions create stress in the substrate under the gate structure.

17. The method of claim 16 which further comprises forming source and drain regions at least partially in the stressor regions.

18. The method of claim 16 which further comprises forming source and drain regions at least partially in the stressor regions and in the substrate adjacent the gate structure, wherein the source and drain regions are formed using an implant process.

19. The method of claim 16 which further comprises forming source and drain regions at least partially in the stressor regions and in the substrate adjacent the gate structure, wherein the source and drain regions are formed by doping the stress material.

20. The method of claim 16 wherein the upper portion comprises slanted sidewalls.

21. The method of claim 16 wherein the etching of the upper portion comprises an anisotropic etch and the etching of the lower portion comprises a dry isotropic etch.

* * * * *